(12) United States Patent
Khursheed

(10) Patent No.: US 7,326,928 B2
(45) Date of Patent: Feb. 5, 2008

(54) ELECTRON MICROSCOPE AND A METHOD OF IMAGING OBJECTS

(75) Inventor: Anjam Khursheed, Chuville (SG)

(73) Assignee: National University of Singapore, Kent Ridge Crescent (SG)

( * ) Notice: Subject to any disclaimer, the term of this patent is extended or adjusted under 35 U.S.C. 154(b) by 158 days.

(21) Appl. No.: 11/288,929

(22) Filed: Nov. 29, 2005

(65) Prior Publication Data

US 2006/0151696 A1    Jul. 13, 2006

Related U.S. Application Data

(60) Provisional application No. 60/631,769, filed on Nov. 29, 2004.

(51) Int. Cl.
*H01J 37/26*    (2006.01)
*H01J 37/153*    (2006.01)

(52) U.S. Cl. .................. 250/310; 250/307; 250/311

(58) Field of Classification Search .................. None
See application file for complete search history.

(56) References Cited

U.S. PATENT DOCUMENTS 5,041,724 A    8/1991    Feuerbaum et al. ........ 250/307
6,495,826 B2    12/2002    Tsuno ........................ 250/305
6,737,647 B2 *    5/2004    Schonhense et al. ........ 250/310
6,897,441 B2 *    5/2005    Khursheed .................. 250/306

\* cited by examiner

*Primary Examiner*—Jack I. Berman
(74) *Attorney, Agent, or Firm*—Marshall, Gerstein & Borun LLP

(57) ABSTRACT

An electron microscope and a method of imaging objects. The method including the steps of: generating at least one electron pulse, each electron pulse including a plurality of electrons with the electrons having a kinetic energy spread; demagnifying each electron pulse using one or more lenses, each lens having a focal strength; dynamically varying said focal strength of at least one of said one or more lenses to compensate for said kinetic energy spread; and forming an image of said object based on interactions at said object resulting from each demagnified pulse. The electron microscope comprising: an electron source adapted to produce a plurality of electron pulses, each electron pulse including a plurality of electrons with the electrons having a kinetic energy spread; one or more lenses adapted to demagnify each of said electron pulses at said object, each lens having a focal strength; compensation means for dynamically varying said focal strength of at least one of said one or more lenses to compensate for said kinetic energy spread; and a detector for forming an image of said object based on interactions at said object resulting from each of said demagnified pulses

23 Claims, 2 Drawing Sheets

ELECTRON MICROSCOPE AND A METHOD OF IMAGING OBJECTS

REFERENCE TO RELATED APPLICATION

This application claims priority from Provisional Application Ser. No. 60/631,769, filed on Nov. 29, 2004, which is expressly incorporated by reference herein.

FIELD OF INVENTION

The invention relates to an electron microscope and a method of imaging objects.

BACKGROUND OF THE INVENTION

Electron microscopes are used to image objects on a very small scale, to overcome limitations in light microscopes. For example Scanning Electron Microscopy (SEM) involves imaging an object of interest by generating a demagnified beam of electrons at an object and detecting the interactions. Interactions may take the form of "secondary electrons" from inelastic interaction, "backscatter electrons" from elastic interactions, x-rays and Auger electrons. Other signals that maybe detected include plasmons, phonons, bremsstrahlung radiation, and cathodoluminescence.

In an SEM type microscope an electron gun emits and accelerates a beam of electrons, which is demagnified by a series of lenses. The demagnefied beam is progressively scanned across the object in a regular pattern, also known as raster scanning. A detector is then used to detect the interactions to form an image. The intensity information from the detector may be translated to a grey scale array of pixels on a display, with brightness corresponding to higher signal intensity.

Generally electromagnetic or electrostatic fields are used to scan and demagnify the beam. For example a condenser lens (often a system of several lenses adjusted by a single control) is used as the primary means of reducing the beam diameter produced by the electron gun. The condenser lens is usually between the electron gun and a series of apertures. An objective lens near the sample demagnifies the beam to the smallest diameter at the surface of the object.

In order to scan the beam across the object non-concentric electromagnetic or electrostatic fields are used to deflect the electron beam. For example one or more scan coils are usually located near or within the objective lens assembly. Because the scan coils can control the position of the beam on the object they may also be used for determining magnification of the image and electronic shifting of the imaged area.

The objective lens (using electric fields, magnetic fields, or a combination of both) demagnifies the primary beam on to the specimen. An ideal lens would demagnify the primary beam of electrons into a perfect point at the specimen, an infinitely small probe, however, in practice, lens aberrations limit the probe to be a finite spot. Chromatic aberration is dominant among these aberrations, which arises from the fact that there is a small range of kinetic energies in the primary beam, called energy spread.

Electron guns inherently involve energy spread, and even cold field emission electron guns have a typical spread of 0.2 eV. Thus in prior art SEMs chromatic aberration results from the objective lens demagnifying the electrons with slightly different energies at slightly different focal positions. This has the effect of defocusing the beam, which distorts the image of the object. Chromatic aberration is one of the main limits on image resolution for SEM, and is greater for lower beam landing energies.

SUMMARY OF THE INVENTION

In accordance with a first aspect of the invention there is provided a method of imaging an object, including the steps of generating at least one electron pulse, each electron pulse including a plurality of electrons with the electrons having a kinetic energy spread, demagnifying electron pulse using one or more lenses, each lens having a focal strength, dynamically varying said focal strength of at least one of said one or more lenses to compensate for said kinetic energy spread, and forming an image of said object based on interactions at said object resulting from each demagnified pulse.

The method may further comprise the step of providing a drift tube for slowing each electron pulse to enhance spatial separation of the electrons in each electron pulse.

Each electron pulse may be substantially focused on a point on said object.

The step of demagnifying may comprise the step of providing a lens to demagnify each electron pulse, and providing a voltage at or within said lens.

The step of dynamically varying the focal strength may comprise dynamically varying the voltage at said lens, to substantially change the focal strength at said object.

The voltage may be varied according to a predetermined waveform.

The predetermined waveform may be a triangular waveform.

The rate of change of said triangular waveform may be greater than 0.5V/ns.

The predetermined waveform may have a period matching the period of pulsed electron beam.

The width of said generated pulse may be less than 100 ps.

In accordance with a second aspect of the invention there is provided an electron microscope for imaging an object, said microscope comprising an electron source adapted to produce a plurality of electron pulses, each electron pulse including a plurality of electrons with the electrons having a kinetic energy spread one or more lenses adapted to demagnify each of said electron pulses at said object, each lens having a focal strength, compensation means for dynamically varying said focal strength of at least one of said one or more lenses to compensate for said kinetic energy spread, and a detector for forming an image of said object based on interactions at said object resulting from each of said demagnifiedpulses.

The compensation means may be adapted such that the focal length of said lens corresponds substantially to a point on said object for each electron pulse.

The electron microscope may further comprise an axis between said electron source and said object, and a drift tube juxtaposed about said axis adapted for slowing each electron pulse to enhance spatial separation of the electrons in each electron pulse.

The one or more lenses may comprise a condenser lens juxtaposed about said axis after said drift tube.

The one or more lenses may further comprise an objective lens juxtaposed about said axis proximate said object.

The electron microscope may further comprise a signal generator adapted to supply a dynamically varying voltage to an electrode within said objective lens, wherein said dynamically varying voltage is adapted to substantially compensate the focal strength of said objective lens for said kinetic energy spread.

The signal generator may be further adapted to supply a triangular waveform voltage to said electrode.

The signal generator may be further adapted to supply said triangular waveform with a rate of change of greater than 0.5 V/ns.

The electron microscope may further comprise one or more scan coils juxtaposed about said axis adapted to direct each of said demagnified pulses progressively over said object to produce interactions at said object.

The electron source may be further adapted to produce pulses widths of less than 100 ps.

The electron source may comprise an electron gun of a type selected from the group of tungsten, cold field emission, and laser pulsed photocathode.

The electron gun may be pulsed to produce said plurality of electron pulses.

The electron gun may alternatively produce a continuous beam of electrons and said electron source further comprising a beam banker unit juxtaposed about said axis and adapted to produce said plurality of electron pulses from said continuous beam.

BRIEF DESCRIPTION OF THE DRAWINGS

Embodiments of the invention will now be described with reference to the drawings, in which.

DETAILED DESCRIPTION OF VARIOUS EMBODIMENTS

Although the following text sets forth a detailed description of numerous different embodiments of the invention, it should be understood that the legal scope of the invention is defined by the words of the claims set forth at the end of this patent. The detailed description is to be construed as exemplary only and does not describe every possible embodiment of the invention since describing every possible embodiment would be impractical, if not impossible. Numerous alternative embodiments could be implemented, using either current technology or technology developed after the filing date of this patent, which would still fall within the scope of the claims defining the invention.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. § 112, sixth paragraph.

Figure 1:
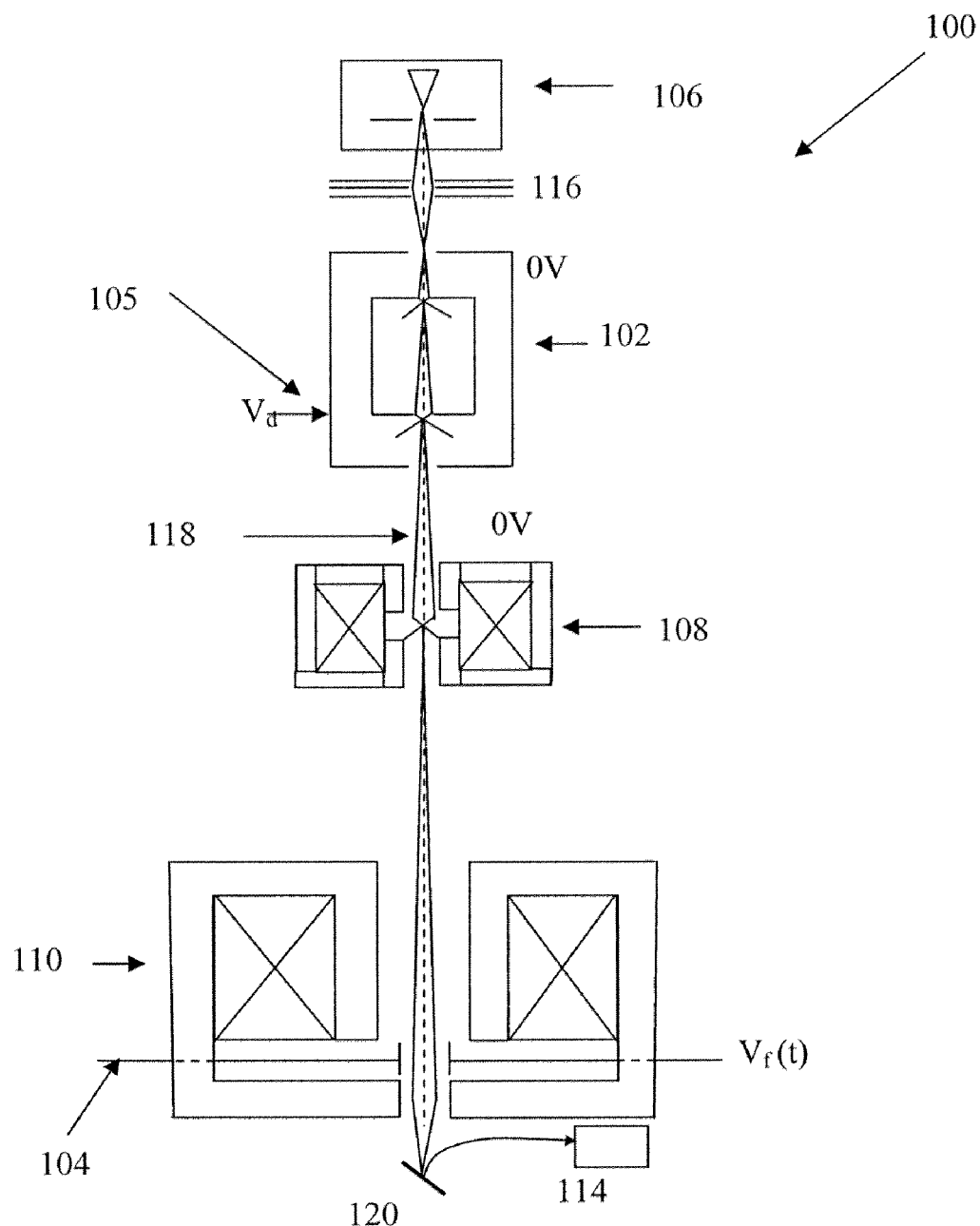
FIG. 1 is a schematic diagram of microscope components.

FIG. 1 exemplifies an example embodiment of a Low Voltage Scanning Electron Microscope (LVSEM) 100. A pulsed electron gun 106 generates an electron beam along an optical axis 118 to a transfer lens 116. The beam then traverses a drift-tube 102 where it is decelerated to an energy of typically less than 10 eV. The purpose of the drift tube 102 is to enhance separation of electrons in the primary beam, both in space and time. After exiting the drift-tube 102, the faster electrons in the beam will be travelling ahead of the slower ones. The beam is then demagnified at an object 120, firstly by a condensing lens 108 and secondly by an objective lens 110. Scan coils progressively scan the beam across the object 120 in a raster pattern and detector 114 provides an output signal of the interactions across the object to form an image.

Electron gun 106 may be a continuous source gun with a beam-blanking unit to provide a pulsed beam. Alternatively electron gun 106 may be pulsed, such as a photocathode. The pulse width may be adjustable for example in the sub-nano-second range, and the period may be adjustable for example in the nano-second range. Pulses of electrons that have short width and are well separated will make it easier to separate the electrons. The electron gun and/or beam blanker unit may for example be capable of pulse widths of less than 100 ps. The electron gun and/or beam blanker unit may in a further example be capable of pulse widths of less than 10 ps.

As will be described in order to compensate for chromatic aberrations the LVSEM 100 incorporates one or more variable focal strength lenses. Each pulse of electrons may become spatially separated according to the inherent kinetic energy spread of the electrons. One or more of the lenses may then be modulated to the correct focal strength for each kinetic energy level, in order to demagnify the entire pulse at the same point (at specimen plane), which reduces or avoid chromatic aberration.

A pulse of electrons moving in drift chamber 102 gradually become spatially separated along optical axis 118. Faster electrons will exit drift chamber 102 earlier and slower electrons will exit later. Time separation for a single pulse may vary from several to tens of nanoseconds.

Drift chamber 102 may not be necessary if the pulsed electrons travel through sufficiently long distance, e.g. in a number of optical components, before reaching objective lens 110, or at a sufficiently low speed, so that there is a sufficient spatial separation in arrival time at objective lens 110. The kinetic energies of the pulsed electrons may also be kept low before they reach objective lens 110 so that they travel at low speeds.

If the energy at the electron gun is between 0.1-10 keV the drift-tube can be configured to lower the kinetic energy to very low energies, typically between 5 to 20 eV. This may be done by applying an appropriate voltage ($V_d$) to an electrode 105 on the drift tube. Drift tube 102 may have an axial length of between 10 and 100 cm.

Objective lens 110 may use electromagnetic or electrostatic fields to demagnify the beam. The voltage ($V_f(t)$) on a central electrode 104 within the objective lens 110 can be modulated in time to vary its focal strength. In order for different energy electrons to be demagnified on to the same plane, the focal strength of the objective lens needs to be varied: high energy electrons require an increase in the focal strength, while lower energy electrons require it to be reduced. By dynamically modulating the objective lens focal strength chromatic aberration can be reduced or avoided and therefore image resolution improved.

The condenser lens 108 is located after the drift tube, as the chromatic aberration of drift tube is relatively high, but is demagnified by the condenser and objective lenses. In this configuration the chromatic aberration of drift tube becomes negligible at the specimen, in comparison to the chromatic aberration of the objective lens.

Similarly any aberrations from the condenser lens are demagnified down by the objective lens, so are relatively small compared to the objective lens aberrations. The dynamic signal applied to the objective lens may also correct for the condenser lens, as well as the drift-tube, but the objective lens aberrations will typically be the most dominant at the specimen.

Figure 2:
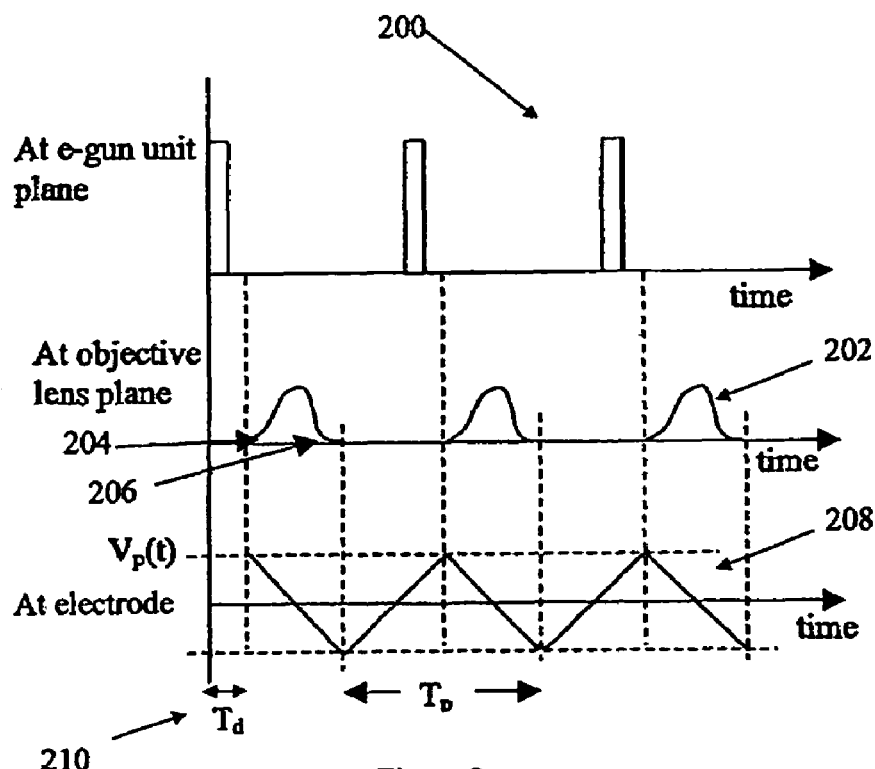
FIG. 2 is a graph of waveforms expected at various components.

FIG. 2 is an example graph showing a train of primary beam pulses 200 along the optical axis created by the electron gun 106. As a result of traversing the drift tube unit, the inherent energy spread of electrons in the primary beam cause the different energy levels to disperse in time and space, so that at the objective lens plane, electrons of differing energies are well separated. This results in a spread pulse 202 with the faster electrons 204 in the primary beam reaching the objective lens first and the slower electrons 206 reach it later. There will be a small amount of time dispersion incurred outside the drift-tube, but because the primary beam's kinetic energy in these regions is much higher than inside the drift tube, the time dispersion at the objective lens plane will be dominated by the action of the drift-tube in the example embodiment.

In order to compensate for the energy spread in the electron pulse, a dynamically varying voltage is applied on an electrode within the objective lens. In FIG. 2 the applied voltage 208 is varied in time, in synchronism with the spread pulse 202 received at the objective lens. For example this voltage may take the form of a triangular wave of the same period as the pulses. The waveform is synchronised with the pulse from the electron gun. A delay factor ($T_d$) 210 is introduced to account for the travel time of the fastest electrons to the objective lens. The delay factor may be calculated based on a known microscope configuration or may be determined experimentally by detecting the spread pulse reaching the objective lens.

A signal generator may supply the voltage to the electrode within the objective lens. The signal generator may for example be capable of varying the voltage by at least 0.5V/ns. The signal generator may in a further example be capable of varying the voltage by at least 1V/ns. The signal generator may in a still further example be capable of varying the voltage by at least 1.5V/ns. While FIG. 2 shows a triangular waveform, modulating waveform may also be more complicated to compensate for non-linearity, so that the effective energy spread can be further reduced. The triangular waveform is an example only and the voltage used may depend on the particular operational requirements.

A relatively small voltage $\Delta V(t)$ (compared to the beam voltage) applied to an electrode placed at the centre of either a magnetic or purely electrostatic lens produces a change of focal position $\Delta Z$ that is approximately equal to the shift produced by correspondingly small energy variations, $\Delta E(t)$ in the beam. This applies only for the situation where the lens central electrode thickness is several times larger than its bore diameter. Therefore, compensation of the chromatic effect may be directly made by setting $\Delta V(t) = -\Delta E(t)$. Note that this method should be able to correct for both axial and first-order transverse chromatic aberrations. This is because it only depends on readjusting the focal strength of the lens in time, so that it has an identical focusing action on electrons with differing energies.

Figure 3:
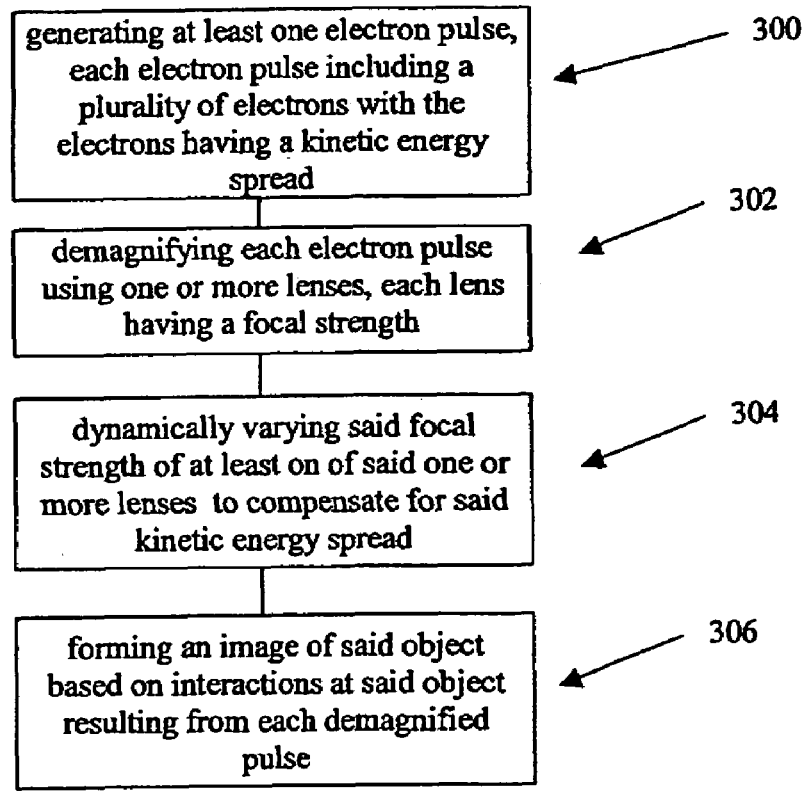
FIG. 3 is a flow diagram of a method of imaging objects.

FIG. 3 shows a flow chart of a method of imaging an object. In step 300 at least one electron pulse is generated, each electron pulse including a plurality of electrons with the electrons having a kinetic energy spread. In step 302 each electron pulse is demagnified using one or more lenses, each lens having a focal strength. In step 304 the focal strength of at least of one of said one or more lenses is dynamically varied to compensate for said kinetic energy spread. In step 306 an image is formed of said object based on interactions at said object resulting from each demagnified pulse.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

What is claimed:

1. A method of imaging an object, including the steps of:
    generating at least one electron pulse, each electron pulse including a plurality of electrons with the electrons having a kinetic energy spread;
    demagnifying each electron pulse using one or more lenses, each lens having a focal strength;
    dynamically varying said focal strength of at least one of said one or more lenses to compensate for said kinetic energy spread; and
    forming an image of said object based on interactions at said object resulting from each demagnified pulse.

2. A method as claimed in claim 1 further comprising the step of providing a drift tube for slowing each electron pulse to enhance spatial separation of the electrons in each electron pulse.

3. A method as claimed in claim 2 wherein each electron pulse is substantially demagnified on a point on said object.

4. A method as claimed in claim 3 wherein said step of demagnifiying comprises the step of providing a lens to demagnify each electron pulse, and providing a voltage at or within said lens.

5. A method as claimed in claim 4 wherein said step of dynamically varying the focal strength comprises dynamically varying the voltage at said lens, to vary the focal strength at said object.

6. A method as claimed in claim 5 wherein said voltage is varied according to a predetermined waveform.

7. A method as claimed in claim 6 wherein said predetermined waveform is a triangular waveform.

8. A method as claimed in claim 7 wherein the rate of change of said triangular waveform is greater than 0.5V/ns.

9. A method as claimed in claim 8 wherein said predetermined waveform having a period matching the period of pulsed electron beam.

10. A method as claimed in claim 1 wherein the width of said generated pulse is less than 100 ps.

11. An electron microscope for imaging an object, said microscope comprising:
    an electron source adapted to produce a plurality of electron pulses, each electron pulse including a plurality of electrons with the electrons having a kinetic energy spread;
    one or more lenses adapted to demagnify each of said electron pulses at said object, each lens having a focal strength;
    compensation means for dynamically varying said focal strength of at least one of said one or more lenses to compensate for said kinetic energy spread; and a detector for forming an image of said object based on interactions at said object resulting from each of said demagnified pulses.

12. The electron microscope as claimed in claim 11 wherein said compensation means is adapted such that the focal length of said lens corresponds substantially to a point on said object for each electron pulse.

13. The electron microscope as claimed in claim 11 further comprising an axis between said electron source and said object, and a drift tube juxtaposed about said axis adapted for slowing each electron pulse to enhance spatial separation of the electrons in each electron pulse.

14. The electron microscope as claimed in claim 13 wherein said one or more lenses comprises a condenser lens juxtaposed about said axis after said drift tube.

15. The electron microscope as claimed in claim 13 wherein said one or more lenses further comprises an objective lens juxtaposed about said axis proximate said object.

16. The electron microscope as claimed in claim 15 further comprising a signal generator adapted to supply a dynamically varying voltage to an electrode within said objective lens, wherein said dynamically varying voltage is adapted to substantially compensate the focal strength of said objective lens for said kinetic energy spread.

17. The electron microscope as claimed in claim 16 wherein said signal generator is further adapted to supply a triangular waveform voltage to said electrode.

18. The electron microscope as claimed in claim 17 wherein said signal generator is further adapted to supply said triangular waveform with a rate of change of greater than 0.5V/ns.

19. The electron microscope as claimed in claim 13 further comprising one or more scan coils juxtaposed about said axis adapted to direct each of said demagnified pulses progressively over said object to produce interactions at said object.

20. The electron microscope as claimed in claim 11 wherein said electron source is further adapted to produce pulses widths of less than 100 ps.

21. The electron microscope as claimed in claim 11 wherein said electron source comprises an electron gun of a type selected from the group of tungsten, cold field emission, and laser pulsed photocathode.

22. The electron microscope as claimed in claim 21 wherein said electron gun is pulsed to produce said plurality of electron pulses.

23. The electron microscope as claimed in claim 21 wherein said electron gun produces a continuous beam of electrons and said electron source further comprising a beam banker unit juxtaposed about said axis and adapted to produce said plurality of electron pulses from said continuous beam.

* * * * *